United States Patent [19]
Roh et al.

[11] Patent Number: 6,060,346
[45] Date of Patent: May 9, 2000

[54] SEMICONDUCTOR DEVICE AND METHOD FOR MANUFACTURING THE SAME

[75] Inventors: Jae Sung Roh, Kyungki-do; Woun S Yang, Chungcheongbuk-do, both of Rep. of Korea

[73] Assignee: LG Semicon Co., Ltd., Chungcheongbuk-do, Rep. of Korea

[21] Appl. No.: 08/931,238

[22] Filed: Sep. 16, 1997

[30] Foreign Application Priority Data

Dec. 27, 1996 [KR] Rep. of Korea ..................... 96/73475

[51] Int. Cl.[7] ................. H01L 21/8238; H01L 21/8228; H01L 21/335; H01L 21/336
[52] U.S. Cl. ......................... 438/200; 438/257; 438/266; 438/279; 438/283; 438/286; 257/365; 257/369; 257/512; 257/563
[58] Field of Search ..................................... 438/668, 600, 438/260, 259, 253, 227, 243; 357/49; 257/526, 369, 365, 331, 316; 156/657

[56] References Cited

U.S. PATENT DOCUMENTS

| | | | |
|---|---|---|---|
| 4,070,230 | 1/1978 | Stein | 156/657 |
| 4,072,982 | 2/1978 | Stein | 357/49 |
| 4,206,005 | 6/1980 | Yeh et al. | 148/1.5 |
| 4,612,465 | 9/1986 | Schutten et al. | 307/584 |
| 4,622,569 | 11/1986 | Lade et al. | 357/23.4 |
| 4,672,423 | 6/1987 | Fowler et al. | 357/23.3 |
| 4,826,781 | 5/1989 | Asahina et al. | 438/243 |
| 5,012,315 | 4/1991 | Shur | 357/23.14 |
| 5,346,844 | 9/1994 | Cho et al. | 438/253 |
| 5,414,287 | 5/1995 | Hong | 257/316 |
| 5,424,575 | 6/1995 | Washio et al. | 257/526 |
| 5,492,846 | 2/1996 | Hara | 438/260 |
| 5,528,056 | 6/1996 | Shimada et al. | 257/72 |
| 5,652,169 | 7/1997 | Jun | 438/600 |
| 5,780,341 | 7/1998 | Ogura | 438/259 |
| 5,882,964 | 3/1999 | Schwalke | 438/227 |

FOREIGN PATENT DOCUMENTS

| | | |
|---|---|---|
| 360138971A | 7/1985 | Japan . |
| 405218211A | 8/1993 | Japan . |
| 409162387A | 6/1997 | Japan . |
| 409219394A | 8/1997 | Japan . |
| 410056077A | 2/1998 | Japan . |

*Primary Examiner*—Tom Thomas
*Assistant Examiner*—Bernard E. Souw

[57] ABSTRACT

A semiconductor device and a method for manufacturing the same that forms a self-aligned contact hole between two gate lines. A substrate is provided that has a first gate line formed thereon. An insulator is formed on the first gate line and substrate. Then a portion of the insulator and a portion of the first gate line is selectively removed to split the first gate line into a second gate line and a third gate line and to concurrently expose the substrate. Thus, producing a self-aligned contact hole between the second and third gate lines.

18 Claims, 7 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and, more particularly, to a semiconductor device having a self-aligned contact hole and a method for manufacturing the same.

2. Discussion of the Related Art

A general process of forming a self-aligned contact hole, which can be easily and precisely made, does not require fitting a mask using a location-fitting margin. Accordingly, high integration can be achieved without utilizing a highly skilled process or highly precise equipment to perform the process.

There are two conventional methods for forming a self-aligned contact hole. In one method, selective etch rates are used. In another method, which is a semi self-alignment method, a contact hole is formed and then an oxide sidewall is formed.

A conventional method for manufacturing a semiconductor device will be explained with reference to the accompanying drawings.

FIGS. 1a to 1c are cross-sectional views showing a method for manufacturing a semiconductor device according to one conventional method and FIGS. 2a to 2c are cross-sectional views showing a method for manufacturing a semiconductor device according to another conventional method. FIG. 3 is a cross-sectional view showing a structure of a semiconductor device manufactured according to a conventional method, which illustrates problems arising from manufacturing the semiconductor device according to a conventional method.

Referring initially to FIG. 1a, an active region and a field region are defined on a substrate 1 and then a field oxide layer is formed on the field region. Next, an oxide layer, a polysilicon layer, and a nitride layer are successively formed on the entire surface of the substrate 1. Subsequently, a photoresist layer is coated on the resultant surface and then selectively patterned. With the patterned photoresist layer serving as a mask, the nitride layer, the polysilicon layer, and the oxide layer are successively etched to form a first and second gate structure 3a and 3b, respectively. The first and second gate structures 3a and 3b comprise a gate oxide layer 2, a gate electrode 3, and a gate cap insulating layer 4. Thereafter, the remaining patterned photoresist layer is removed.

With the first and second gate structures 3a and 3b serving as a mask, lightly doped impurity ions are implanted into the exposed surface of the substrate 1 thereby forming lightly doped source and drain regions 5. Next, a nitride layer is deposited over the substrate 1 and anisotropically etched to form sidewall spacers 6 on the sides of the first and second gate structures 3a and 3b, respectively. With the first and second gate structures 3a and 3b and the sidewall spacers 6 serving as a mask, heavily doped impurity ions are implanted into the exposed surface of the substrate 1 thereby forming a heavily doped source/drain region 7.

Referring to FIG. 1b, there is formed an interlayer insulating layer 8 over the substrate 1. Then a photoresist layer is formed on the interlayer insulating layer 8 and exposed and developed to form the patterned photoresist layer 9.

Referring to FIG. 1c, with the patterned photoresist layer 9 serving as a mask, the interlayer insulating layer 8 is anisotropically etched using a high selective etch rate of the oxide and nitride layers until the surface of the substrate 1 is exposed, thus forming a contact hole. The high selective etch rate is described as the nitride or oxide layer being easily etched and the polysilicon layer not being easily etched or vice-versa. Next, on the entire surface of the substrate 1, there is formed a conductive material such as polysilicon, aluminum, or tungsten that are patterned to form a bit line 10. Another conventional method for manufacturing a semiconductor device will be explained with reference to FIGS. 2a–2c.

Referring initially to FIG. 2a, there are defined an active region and a field region in the substrate 11. A field oxide layer is formed on the field region. Then, a first oxide layer, a polysilicon layer, and a second oxide layer are successively formed on the entire surface of the substrate 11. Subsequently, a photoresist layer is coated on the resultant surface and then exposed and developed to form a patterned photoresist layer. With the patterned photoresist layer serving as a mask, the first oxide layer, the polysilicon layer, and the second oxide layer are successively etched to form a first and second gate structure 13a and 13b, respectively. The first and second gate structures 3a and 3b comprise a gate oxide layer 12, a gate electrode 13, and a gate cap insulating layer 14 on a predetermined portion of the substrate 11. Thereafter, the remaining patterned photoresist layer is removed.

With the first and second gate structures 13a and 13b serving as a mask, lightly doped impurity ions are implanted into the exposed surface of the substrate 11 thereby forming lightly doped source and drain regions 15. Next, an oxide layer is formed on the resultant surface and then anisotropically etched to form sidewall spacers 16 on sides of the first and second gate structures 13a and 13b. With the sidewall spacers 16 and first and second gate structures 13a and 13b serving as a mask, heavily doped impurity ions are implanted into the substrate 11 thereby forming a heavily doped source/drain region 17.

Referring to FIG. 2b, on the resultant surface, there is deposited an interlayer insulating layer 18 using a chemical vapor deposition (CVD) method. Next, a photoresist layer is coated on the resultant surface and then exposed and developed to form a patterned photoresist layer 19.

Referring to FIG. 2c, with the patterned photoresist layer 19 serving as a mask, the interlayer insulating layer 18 is anisotropically etched in between the first and second gate structures 13a and 13b to expose the surface of the source/drain region 17 thereby forming a contact hole. Then, an oxide layer is formed on the resultant surface and then anisotropically etched to form oxide sidewall spacers 20 on sides of the interlayer insulating layer 8. Subsequently, a conductive material such as polysilicon, aluminum, or tungsten is formed on the entire surface and then patterned to form a bit line 21. In this case, the oxide sidewall spacers 20 serve to insulate the gate electrode 13 from the bit line 21.

Problems arising from semiconductor devices manufactured according to the conventional methods will be explained with reference to FIG. 3.

As shown in FIG. 3, when an alignment tolerance is beyond the limit of a photolithography process, formation of a contact hole is misaligned on a gate electrode 13. Consequently, a short between the gate electrode 13 and the bit line 21 is generated even after the oxide sidewall spacers 20 are formed.

Conventional methods for manufacturing a semiconductor device have the following problems.

First, it is difficult to carry out an etch process over materials such as a nitride and an oxide having a high selective etch rate. If a selective etch rate is high, a polymer may be generated that blocks a contact hole and stops the etch process. Moreover, it is difficult to simplify the overall process.

Second, for a high density device, alignment tolerance easily goes beyond the limit of a photolithography process that causes misalignment when forming a contact hole. Because of misalignment, a short between a gate electrode and a bit line is generated that destroys the operability of a unit device.

SUMMARY OF THE INVENTION

Therefore, the present invention is directed to a semiconductor device and a method for manufacturing the same that substantially obviate one or more of problems due to limitations and disadvantages of the related art.

An object of the present invention is to provide a semiconductor device having a self-aligned contact hole and a method for manufacturing the same.

Another object of the present invention is to provide a semiconductor device having unsymmetrical source and drain regions and a method for manufacturing the same.

To achieve these and other advantages and in accordance with the purpose of the present invention, as embodied and broadly described, there is provided a semiconductor device having a self-aligned contact hole, the device comprising: a substrate; a first conductor structure and a second conductor structure formed on the substrate; an insulator structure formed on the first and second conductor structure and on the substrate except over the substrate in a region between the first and second conductor structures; and sidewall spacers formed on a side of the first and second conductor structures and on a side of the insulator structure, the sidewall spacers defining the self-aligned contact hole in the region between the first and second conductor structures.

In another aspect of the invention, there is provided a method for self-aligning a contact hole between two conductor structures in a semiconductor device, the method comprising the steps of: providing a substrate; forming a first conductor structure on the substrate; forming an insulator structure on the first conductor structure and substrate; and selectively removing a portion of the insulator structure and a portion of the first conductor structure to split the first conductor structure into a second conductor structure and a third conductor structure and to concurrently expose the substrate thereby producing a self-aligned contact hole between the second and third conductor structures.

In another aspect of the present invention, there is provided an unsymmetrical semiconductor device using a self-aligned contact hole, the device comprising: a substrate having impurity regions formed therein; a first conductor structure and a second conductor structure formed on the substrate; an insulator structure formed on the first and second conductor structures and on the substrate except over the substrate in a region between the first and second conductor structures; first sidewall spacers formed on a side of the first and second conductor structures and on a side of the insulator structure, the first sidewall spacers defining the self-aligned contact hole in the region between the first and second conductor structures; and second sidewall spacers formed on sides of the first and second conductor structures opposite of the self-aligned contact hole.

In still another aspect of the present invention, there is provided a method for forming an unsymmetrical semiconductor device using a precisely aligned contact hole, the method comprising the steps of: providing a substrate; forming a first conductor structure on the substrate; forming a first impurity region in the semiconductor substrate at sides of the first conductor structure; forming an insulator structure on the first conductor structure and substrate; selectively removing a portion of the insulator structure and a portion of the first conductor structure to split the first conductor structure into a second and third conductor structure and to concurrently expose the substrate thereby producing a self-aligned contact hole between the second and third conductor structures; and forming a second impurity region in the self-aligned contact hole.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Reference will now be made in detail to the preferred embodiments of the present invention, examples of which are illustrated in FIGS. 4, 5, and 6a–6b.

Figure 1A:
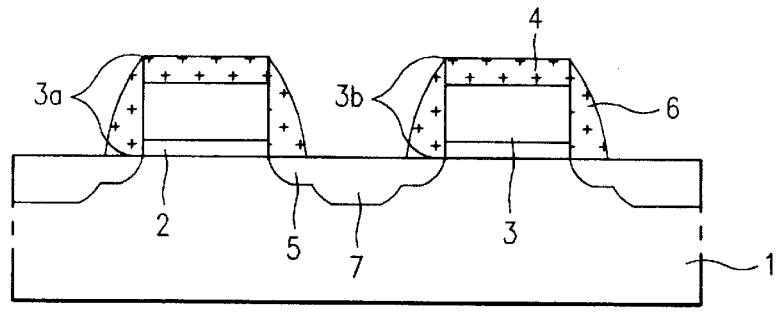
FIGS. 1a to 1c are cross-sectional views showing a conventional method for manufacturing a semiconductor device.
Figure 1B:
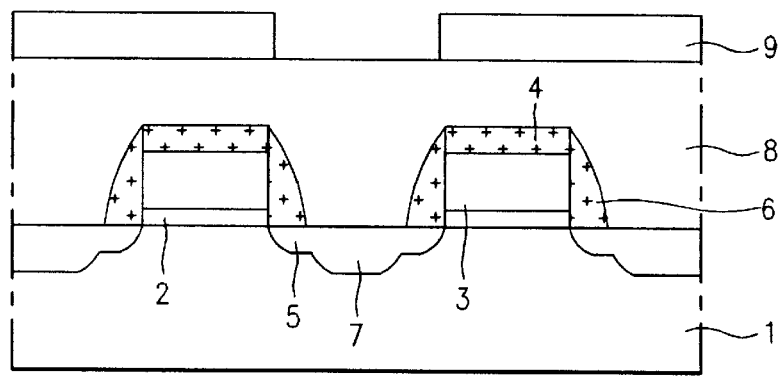
Figure 1C:
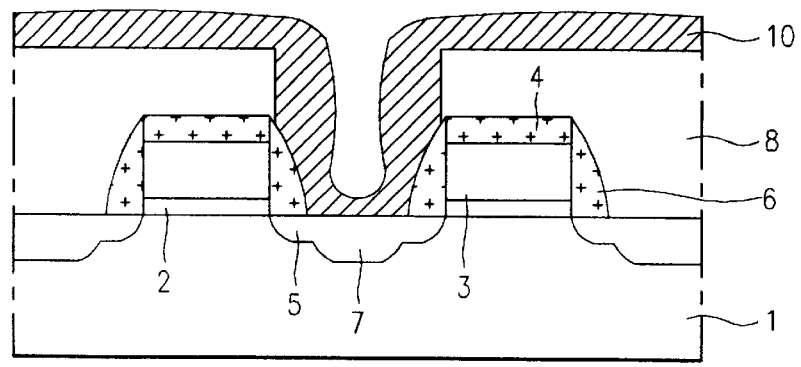
Figure 2A:
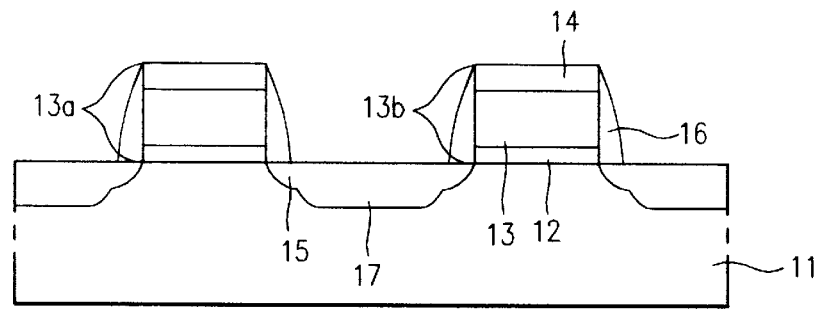
FIGS. 2a to 2c are cross-sectional views showing another conventional method for manufacturing a semiconductor device.
Figure 2B:
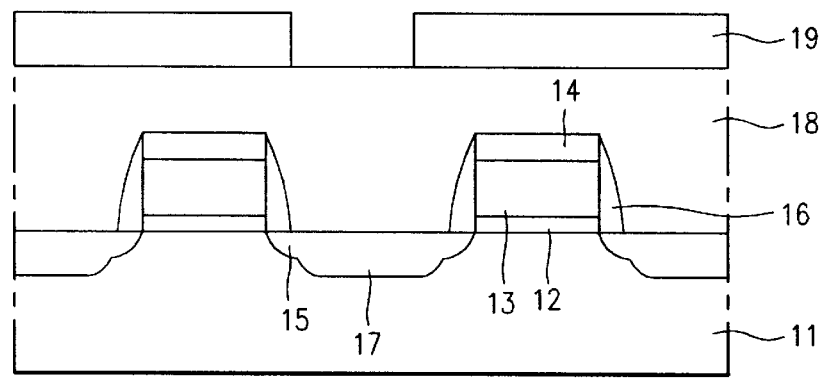
Figure 2C:
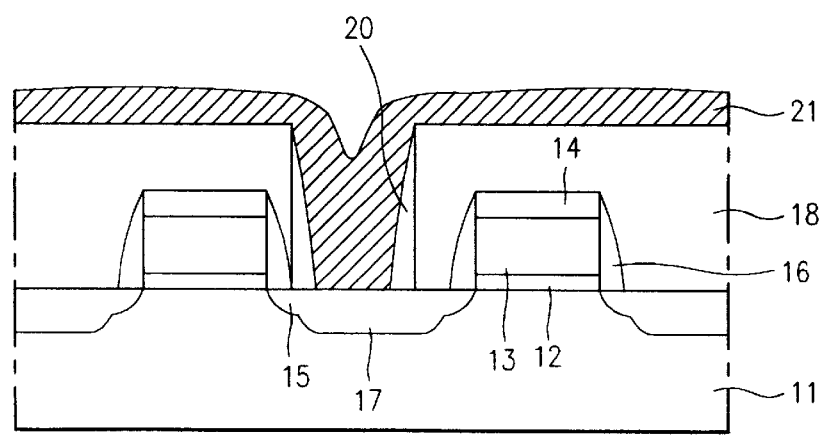
Figure 3:
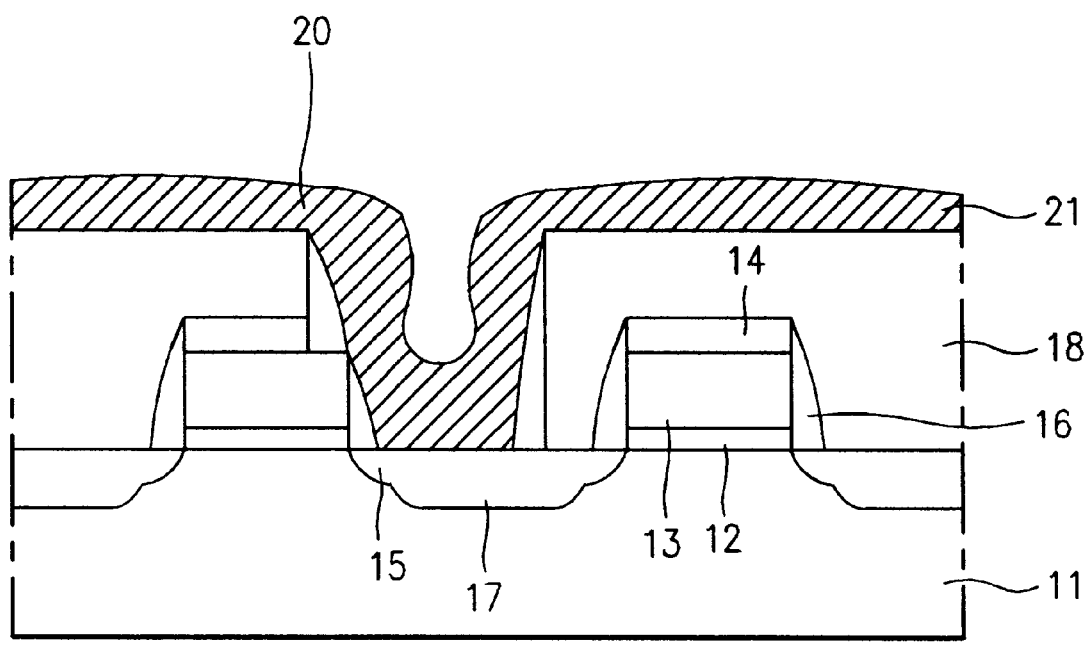
FIG. 3 is a cross-sectional view of a semiconductor device manufactured according to a conventional method.
Figure 4:
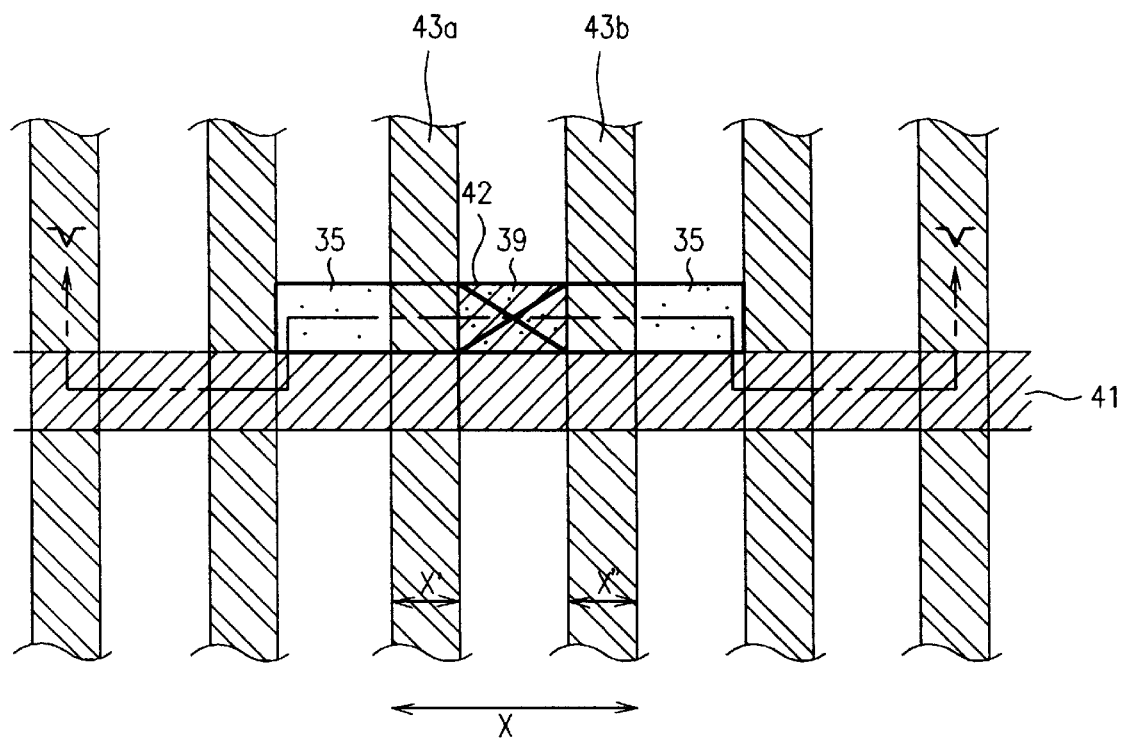
FIG. 4 is a plan view of a semiconductor device according to the present invention.
Figure 5:
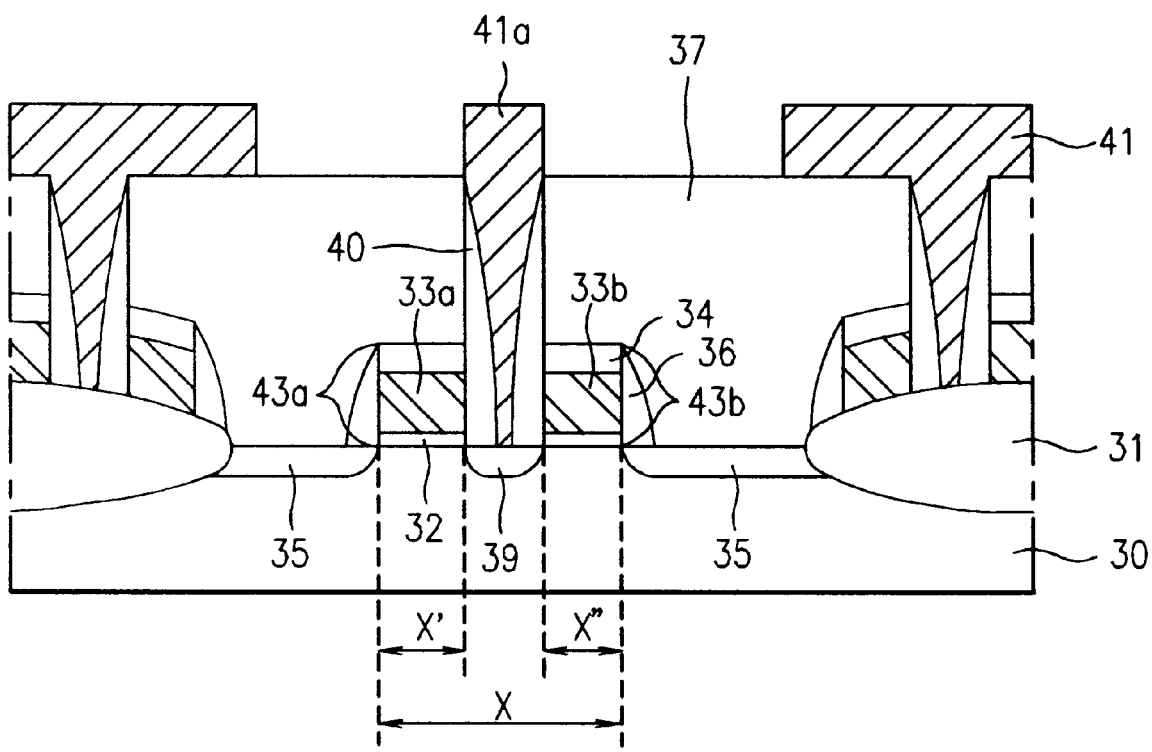
FIG. 5 is a cross-sectional view across the line V—V in FIG. 4 according to the present invention.

Referring to FIGS. 4 and 5, the structure of the semiconductor device according to the present invention will first be described. In FIG. 4, the plan view of the semiconductor device according to the present invention illustrates a first source/drain region 35 and a second source/drain region 39. A gate line, which had a width of X, is divided into a first gate line 43a and a second gate line 43b having a width of X' and X", respectively. The area 42 having an "X" drawn therethrough represents a contact plug area wherein a contact plug is in contact with a second source/drain region 39. The contact plug is also in contact with the bit line 41.

In FIG. 5, the cross-sectional view of the semiconductor device taken along the line V—V of FIG. 4 illustrates a field region and an active region defined on a substrate 30 and a field oxide layer 31 formed on the field region. A gate line 43 (see FIG. 6a) having a width of X is formed over the active region of the substrate 30. The gate line 43, preferably, comprises a gate oxide layer 32 formed on the substrate 30, a conductive line 33, which is also a gate electrode, formed on the gate oxide layer 32, and a gate cap insulator layer formed on the conductive line 33. The gate line 43 is divided into two gate lines which are the first and second gate lines 33a and 33b having widths of X' and X", respectively, as shown in FIG. 5. The first gate line 43a comprises a gate oxide layer 32 formed on the substrate 30, a conductive line 33a formed on the gate oxide layer 32, and a gate cap insulator layer 34 formed on the conductive line 33a. The second gate line 43b has the same structure of the first gate line 43a having a conductive line 33b instead of a conductive line 33a.

A contact hole is formed between the first and second gate lines 43a and 43b and an interlayer insulating layer 37 is formed on the first and second gate lines 43a and 43b and on the substrate 30.

Source and drain regions 35 are formed in the substrate 30 at outer sides of the first and second gate lines 43a and 43b. A second source/drain region 39 is formed in the substrate 30 between the first and second gate lines 43a and 43b. While gate insulating sidewalls 36 are formed on the outer sides of the gate lines 43a and 43b, oxide sidewall spacers 40 are formed on the inner sides of the gate lines 43a and 43b and the interlayer insulating layer 37. A contact plug 41a is formed in contact with the second source/drain region 39. Structures on the field oxide layer 31 serve as "dummy" structures which do not serve any functional purpose. The method according to the invention emphasizes forming transistors in active regions, and is described in terms of forming structures in the field regions that correspond to the structures in the active regions. In particular, on the field oxide layers 31, structures corresponding to the gate electrodes 33a and 33b, the gate cap insulators 34, the sidewall spacers 36 and 40 and the plug 41a are formed. But because they are formed on the field oxide layers 31, they represent inoperative transistors. Forming these inoperative transistors in the field regions is not necessary to practice the method according to the invention. But it has been determined that forming the structures in the field regions as well as in the active regions has advantages, from an ease-of-manufacturing point of view. Thus, it is preferable but not necessary, to form the inoperative transistors in the field regions at the same time that the corresponding transistors are formed in the active regions.

A method for manufacturing a semiconductor device having the aforementioned structure of FIG. 5 according to the present invention will be explained with reference to FIGS. 6a–6d.

Figure 6A:
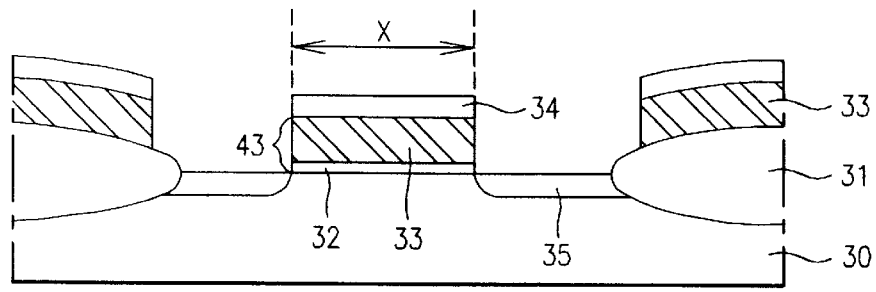
FIGS. 6a to 6d are cross-sectional views showing a method for manufacturing a semiconductor device according to a preferred embodiment of the present invention.

Referring initially to FIG. 6a, a field region and an active region are defined in a substrate 30 and then a field oxide layer is formed on the field region. Next, a first thin oxide layer is formed on the entire surface of the substrate 30 using a thermal oxidation process, and then a polysilicon layer and a second oxide layer are successively formed on the first thin oxide layer. In this case, a nitride layer can be deposited in place of the second oxide layer.

Subsequently, the first oxide layer, the polysilicon layer, and the second oxide layer are anisotropically etched to form a gate line 43 that comprises a gate oxide layer 32, a conductive line 33, and a gate cap insulating layer 34, which has a width of X.

Figure 6B:
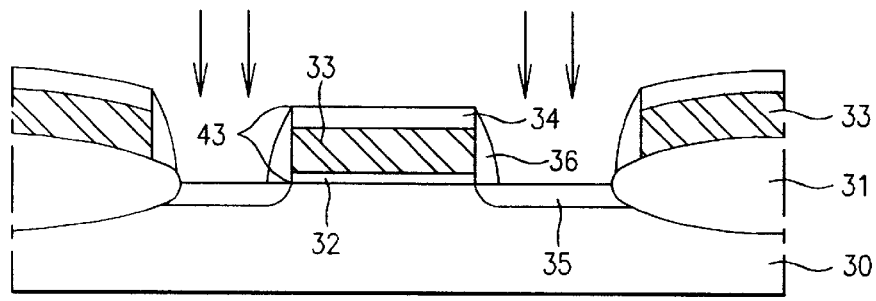

Referring to FIG. 6b, with the gate line 43 serving as a mask, lightly doped impurity ions of either an N type or P types are implanted into the substrate 30 thereby forming first source and drain regions 35. Next, either of an oxide layer or a nitride layer is formed and then anisotropically etched to form gate insulating sidewalls 36 on the sides of the gate line 43.

Figure 6C:
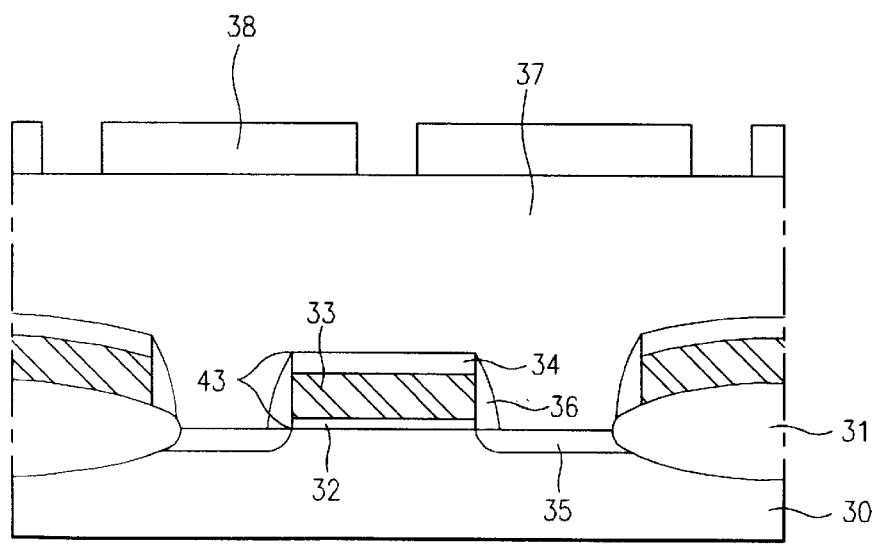

Referring to FIG. 6c, an interlayer insulating layer 37 of an oxide is formed on the entire surface of the substrate 30 using a chemical vapor deposition (CVD) method, and then a photoresist layer is coated on the entire surface and patterned using a contact hole mask to form a patterned photoresist layer 38.

Subsequently, with the patterned photoresist layer 38 serving as a mask, the interlayer insulating layer 37 and the gate line 33 are etched such that the gate line 33 is divided into two gate lines. The two gate lines form a first gate line 43a having a width of X' and a second gate line 43b having a width of X" (See FIG. 4).

Figure 6D:
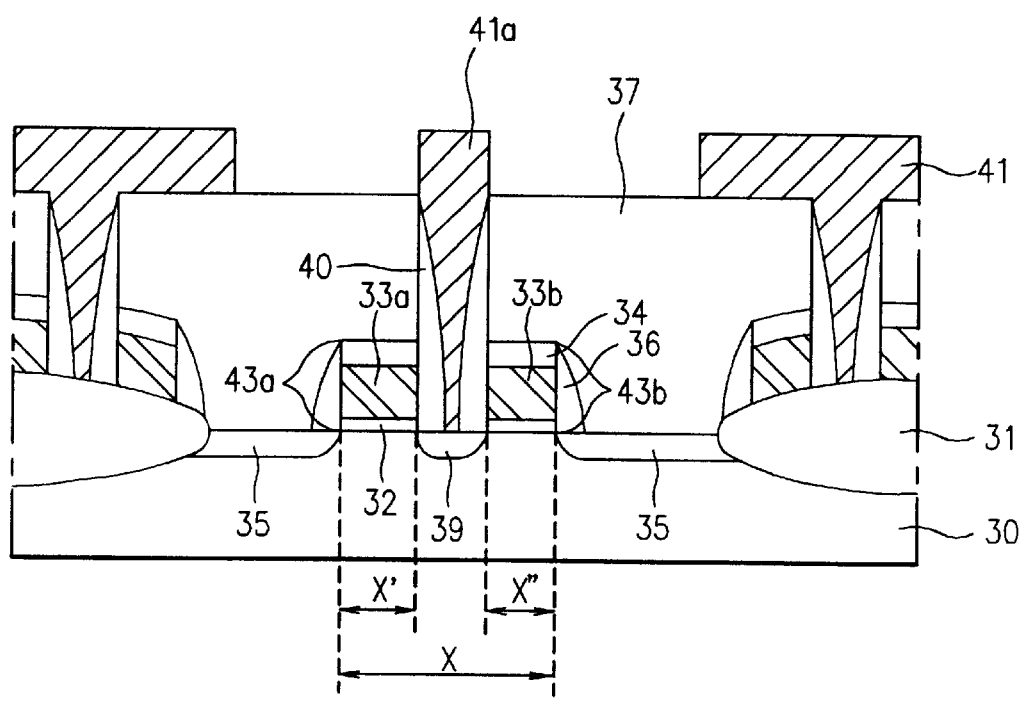

Referring to FIG. 6d, the remaining patterned photoresist layer 38 is removed. Impurity ions are implanted into the exposed surface of the substrate 30 between the first and second gate lines 43a and 43b, thus forming a second source/drain region 39. In this case, the second source/drain region 39 has the same impurity ions as the first source/drain regions 35. However, the concentration of the first and second source/drain regions 35 and 39 are different. The ions of a different concentration are implanted and a thermal diffusion is carried out, forming an unsymmetrical device, (i.e., source and drain regions having different ion concentrations).

An oxide layer is then subsequently formed and anisotropically etched to form oxide sidewall spacers 40 on inner sides of the first and second gate lines 43a and 43b and on a side surface of the interlayer insulating layer 37. Subsequently, a conductive material is formed on the entire surface and then patterned to form a contact plug 41a and a bit line 41 whereby the bit line 41 connects with the contact plug 41a. Thus, the above process completes the semiconductor device of the present invention. Also, the conductive material for the bit line plug 41a and the bit line 41 are preferably a polysilicon, aluminum, or tungsten type material.

A method for manufacturing a semiconductor device of the present invention has the following advantages.

First, since oxide sidewall spacers 40 are formed (after dividing a gate line into two gate lines) on an inner side surface between the two gate lines, a contact plug, which is in contact with a bit line, is not formed over the gate lines avoiding a short between the gate lines and a bit line. As a result, a device having of good reliability can be manufactured.

Second, a mask to divide the gate line can be replaced with a conventional mask to define a contact hole. Thus, the manufacturing process becomes simplified, e.g., because the mask inventory can be reduced by one mask.

Third, by splitting a single gate line structure in the present invention, a contact hole is concurrently formed along with the two gate lines, which permits a single masking step to replace the separate masking steps needed to form the two gate lines and for the contact hole.

Fourth, first source drain regions at both sides of the gate lines and a second source/drain in between the divided gate lines are formed, respectively, by ion implantation of different concentrations, thereby forming an unsymmetrical device.

Fifth, a more precise contact hole is formed by dividing a single gate line into two gate lines that avoid aligning a contact hole between the two gate lines.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for self-aligning a contact hole between two conductor structures in a semiconductor device, the method comprising the steps of:

providing a semiconductor substrate;

forming a large gate structure an the substrate;

forming an insulator structure on the large gate structure and the semiconductor substrate; and selectively removing a portion of the insulator structure and a portion of the large gate structure to split the large gate structure into a first small gate structure and a second small gate structure and to concurrently expose the semiconductor substrate thereby producing a self-aligned contact hole between the first and second small gate structures structures.

2. The method of claim 1, further comprising the step of:

forming a sidewall spacer against each side of the self-aligned contact hole, each sidewall spacer being located against a side of the first and second small gate structures, respectively, and against a side of the insulator structure.

3. The method of claim 1, wherein the step of forming the large gate structure includes the steps of:

forming a gate oxide layer on the semiconductor substrate;

forming a conductive layer on the gate oxide layer; and forming a gate cap insulating layer on the conductive layer.

4. The method of claim 1, wherein the step of selectively removing includes the step of:

etching the large gate structure using a contact hole mask.

5. A method for forming a precisely aligned contact plug for a metalization pattern using a self-aligned contact hole between two conductor structures in a semiconductor device, the method comprising the steps of:

providing a substrate;

forming a first conductor structure;

forming an insulator structure on the first conductor structure and substrate;

selectively removing a portion of the insulator structure and a portion of the first conductor structure to split the first conductor structure into a second conductor structure and a third conductor structure and to concurrently expose the substrate thereby producing a self-aligned contact hole between the second and third conductor structures;

forming sidewall spacers against the sides of the self-aligned contact hole, the sides being formed from sides of the insulator structure and a side of the first and second conductor structures, respectively; and forming a contact plug in the contact hole against sidewall spacers and in contact with the exposed substrate.

6. The method of claim 5, wherein the second and third conductor structures are first and second gate structures.

7. The method of claim 6, wherein the contact plug is not disposed directly above the first and second gate structures.

8. The method of claim 5, wherein the step of forming the first conductor structure includes the steps of:

forming an gate oxide layer on the substrate;

forming a conductive layer on the gate oxide layer; and forming a gate cap insulating layer on the conductive layer.

9. The method of claim 5, further comprising the step of:

forming the metalization pattern on the insulator structure and on the contact plug.

10. The method of claim 9, wherein the metalization pattern is a bit line pattern.

11. A method for forming an unsymmetrical semiconductor device using a precisely aligned contact hole, the method comprising the steps of:

providing a substrate;

forming a first conductor structure on the substrate;

forming a first impurity region in the semiconductor substrate at sides of the first conductor structure;

forming an insulator structure on the first conductor structure and substrate;

selectively removing a portion of the insulator structure and a portion of the first conductor structure to split the first conductor structure into a second and third conductor structure and to concurrently expose the substrate thereby producing a self-aligned contact hole between the second and third conductor structures; and forming a second impurity region in the self-aligned contact hole.

12. The method of claim 11, wherein the ion concentration in the first impurity region is different than the ion concentration of the second impurity region.

13. The method of claim 12, wherein the ions in the first impurity region and second impurity region are of the same type of impurity.

14. The method of claim 11, wherein the step of selectively removing includes the step of:

etching the first conductor structure using a contact hole mask.

15. The method of claim 11, wherein the forming a first impurity region step includes the steps of:

forming first sidewall spacers on sides of the first conductor structure; and implanting ions into the substrate.

16. The method of claim 15, further comprising the steps of:

forming second sidewall spacers against each side of the self-aligned contact hole, respectively, each second sidewall spacer being located against a side of the second and third conductor structures and against a side of the insulator structure; and forming a contact plug in the self-aligned contact hole, the contact plug being in contact with the second impurity region and the second sidewall spacers.

17. The method of claim 16, wherein the contact plug is not disposed directly above the second and third conductor structures.

18. The method of claim 11, wherein the second and third conductor structures are first and second gate structures.

* * * * *